United States Patent
Ito et al.

(10) Patent No.: US 10,434,748 B2
(45) Date of Patent: Oct. 8, 2019

(54) CONDUCTIVE FILM

(71) Applicant: FUJIFILM Corporation, Tokyo (JP)

(72) Inventors: Koju Ito, Minamiashigara (JP); Souichi Kohashi, Minamiashigara (JP); Hiroshi Yabu, Sendai (JP); Kuniaki Nagamine, Sendai (JP); Matsuhiko Nishizawa, Sendai (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/977,773

(22) Filed: May 11, 2018

(65) Prior Publication Data

US 2018/0257336 A1    Sep. 13, 2018

Related U.S. Application Data

(63) Continuation of application No. PCT/JP2016/083170, filed on Nov. 9, 2016.

(30) Foreign Application Priority Data

Nov. 13, 2015 (JP) .................. 2015-222972

(51) Int. Cl.
*B32B 7/02* (2019.01)
*C08J 9/26* (2006.01)
(Continued)

(52) U.S. Cl.
CPC .................. *B32B 7/02* (2013.01); *B32B 3/12* (2013.01); *C08J 9/26* (2013.01); *C08J 9/28* (2013.01);
(Continued)

(58) Field of Classification Search
CPC .... B32B 7/02; B32B 3/12; C08J 9/365; C08J 9/28; C08J 9/26; C08J 9/36;
(Continued)

(56) References Cited

U.S. PATENT DOCUMENTS

| | | | |
|---|---|---|---|
| 2004/0121687 A1* | 6/2004 | Morman | A61F 13/4902 442/328 |
| 2009/0134553 A1 | 5/2009 | Yamazaki et al. | |
| 2010/0171231 A1* | 7/2010 | Shimomura | B01D 67/003 264/49 |

FOREIGN PATENT DOCUMENTS

| | | |
|---|---|---|
| JP | 11-121974 A | 4/1999 |
| JP | 2004-276443 A | 10/2004 |

(Continued)

OTHER PUBLICATIONS

[NPL-1] Yamato et al. (JP 2014-124906 A) Jul. 2014 (JPP machine translation to English). (Year: 2014).*

(Continued)

*Primary Examiner* — David Sample
*Assistant Examiner* — Donald M Flores, Jr.
(74) *Attorney, Agent, or Firm* — Birch, Stewart, Kolasch & Birch, LLP

(57) ABSTRACT

There is provided a conductive film having conductivity in a surface direction, being deformable, having excellent durability, and transmitting visible light.

A conductive film includes a film substrate and a conductive material layer. The conductive material layer is provided on a first substrate surface of the film substrate. A plurality of through holes penetrating the film substrate and the conductive material layer in a thickness direction are formed in the conductive film. The conductive material layer has a plurality of conductive portions, and the conductive portions are present between adjacent layer opening portions. The number of the conductive portion is 400 per 1 mm$^2$, and an opening ratio of the conductive material layer is at least 40%.

9 Claims, 13 Drawing Sheets

(51) Int. Cl.
*C08J 9/36* (2006.01)
*H01B 5/14* (2006.01)
*H05K 9/00* (2006.01)
*B32B 3/12* (2006.01)
*C08J 9/28* (2006.01)

(52) U.S. Cl.
CPC .............. *C08J 9/36* (2013.01); *C08J 9/365* (2013.01); *H01B 5/14* (2013.01); *H05K 9/00* (2013.01); *C08J 2201/0502* (2013.01); *C08J 2309/00* (2013.01); *C08J 2383/04* (2013.01); *C08J 2400/26* (2013.01); *C08J 2433/26* (2013.01); *Y10T 428/24967* (2015.01)

(58) Field of Classification Search
CPC .............. C08J 2433/26; C08J 2383/04; C08J 2309/00; C08J 2201/0502; C08J 2400/26; H05K 9/00; H01B 5/14; Y10T 428/24967
See application file for complete search history.

(56) References Cited

FOREIGN PATENT DOCUMENTS

| JP | 2006-70254 A | 3/2006 |
|---|---|---|
| JP | 2007-73389 A | 3/2007 |
| JP | 2007-291367 A | 11/2007 |
| JP | 2009-73124 A | 4/2009 |
| JP | 2011-216373 A1 | 10/2011 |
| JP | 2012-248346 A1 | 12/2012 |
| JP | 2014-124906 A | 7/2014 |
| JP | 2014124906 A * | 7/2014 |
| JP | 2014-175609 A | 9/2014 |
| JP | 2014-212211 A | 11/2014 |
| WO | WO 2006/014009 A1 | 2/2006 |
| WO | WO 2007/114421 A1 | 10/2007 |

OTHER PUBLICATIONS

International Preliminary Report on Patentability and Written Opinion of the International Searching Authority(Forms PCT/IB/326, PCT/IB/373 and PCT/ISA/237), dated May 24, 2018, for corresponding International Application No. PCT/JP2016/083170, with an English Translation of the Written Opinion.

International Search Report (Form PCT/ISA/210), dated Feb. 14, 2017, for corresponding International Application No. PCT/JP2016/083170, with an English Translation.

Office Action for corresponding Japanese Application No. 2015-222972, dated Apr. 23, 2019, with English translation.

* cited by examiner

Deswelling ⇔ Reverible ⇔ Swelling

CONDUCTIVE FILM

CROSS-REFERENCE TO RELATED APPLICATIONS

This application is a Continuation of PCT International Application No. PCT/JP2016/083170 filed on 9 Nov. 2016, which claims priority under 35 U.S.C § 119(a) to Japanese Patent Application No. 2015-222972 filed on 13 Nov. 2015. The above application is hereby expressly incorporated by reference, in its entirety, into the present application.

BACKGROUND OF THE INVENTION

1. Field of the Invention

The present invention relates to a conductive film

2. Description of the Related Art

There is a need for a biometric sensor which is non-invasive or minimally invasive for the tissue surface of a living body. As such a biometric sensor, so-called smart contact lenses for detecting a blood glucose level or the intraocular pressure have been proposed. In a biometric sensor having a lens shape such as a smart contact lens, it is desirable that a conductive material that is used as an electrode material transmits visible light.

Many conductive materials that transmit visible light have been proposed. For example, JP1999-121974A (JP-H11-121974A) discloses a conductive material that transmits visible light, as an electromagnetic wave shielding plate that includes a transparent resin (polymer) substrate and a conductive mesh including a metal thin film laminated on the resin substrate. JP2014-175609A discloses a conductive mesh sheet including a transparent resin substrate and a conductive mesh that is provided on the resin substrate and defines a plurality of opening regions and transmitting visible light. The conductive mesh in the conductive material as described above includes a plurality of conductive portions surrounding the opening region as a mesh, and the conductive portions are connected to each other at the end portions thereof to form a conductive path.

Most of the tissue surface is a curved surface such as a spherical surface, and is usually deformed (for example, bent, stretched, and twisted). Therefore, the conductive material for use on the tissue surface is required to have shape correspondence capable of being deformed so as to also follow a curved surface and the like and/or deformation followability capable of following the deformation of a bonding target. These so-called deformable conductive materials have also been proposed so far. For example, a wiring structure as a conductive material disclosed in JP2012-248346A is used for a biometric sensor to be stuck on a tissue surface of a living body, and includes a base layer as a substrate, a conductive layer, and a cover layer. The base layer is formed of a flexible resin material, for example, polydimethylsiloxane. An uneven portion in which a cross section shape is a wave shape is formed on the surface of the base layer, and the conductive layer is provided on the uneven portion. The cover layer is formed of a flexible resin material and is provided on the conductive layer.

As a conductive material, as disclosed in JP2011-216373A, a nonwoven fabric formed of a resin fiber whose surface is coated with metal may be provided. JP2007-073389A discloses a conductive film in which a plurality of minute holes penetrating in the thickness direction are formed side by side along the film surface to form a honeycomb-like structure, and in which an electroless plating layer is formed on the surface of partitions between the adjacent holes. This conductive film is an anisotropic conductive film exhibiting conductivity only in the thickness direction, and individual holes are independent.

SUMMARY OF THE INVENTION

However, conductive materials of JP1999-121974A (JP-H11-121974A), JP2014-175609A, and JP2011-216373A deform a little bit, but are hardly considered to be deformable because the degree of deformation that may be elongated or bent is small. A conductive material of JP2012-248346A is in the form of a film, in order to exhibit or maintain a deforming function such as bending and/or expansion and contraction, the thickness of a base layer which is a substrate is caused to be as thick as 300 μm, a cover layer is provided on a conductive layer, and thus the thickness as the material is large. Accordingly, the use thereof is limited. With respect to conductivity, the conductive material disclosed in JP2012-248346A has a certain durability to endure repeated deformation, but a durable number of repetitions is still small. The conductive material of JP2007-073389A does not have conductivity along the film surface, in a so-called surface direction, and thus may not be used in a case where conductivity is required in the surface direction such as an electrode material of the biometric sensor.

An object of the present invention is to provide a conductive film having conductivity in the surface direction, being deformable, having excellent durability, and transmitting visible light.

1 In order to achieve the above objects, a conductive film of the present invention comprises a film substrate and a conductive material layer provided on a film substrate surface on one side of the film substrate, in which a plurality of through holes penetrating the film substrate and the conductive material layer in a thickness direction are formed, and in which the conductive material layer has conductive portions between adjacent opening portions, the number of conductive portions is at least 400 per 1 mm$^2$, and an opening ratio of the conductive material layer is at least 40%.

It is preferable that a thickness of the film substrate is in a range of 0.2 μm to 20 μm. It is preferable that the film substrate includes a hydrophobic polymer. It is preferable that the hydrophobic polymer includes any one of polybutadiene, polyisoprene, a polydimethylsiloxane derivative, or polyisobutylene.

It is preferable that the plurality of through holes are regularly arranged along the film substrate surface on one side, it is preferable that the film substrate has a honeycomb-like structure in a case of being seen in a vertical direction of the film substrate surface on one side, and also it is preferable that a thickness of a partition between the adjacent through holes gradually decreases toward a center of the film substrate in a thickness direction. It is preferable that the partition has a partition wall opening portion on the center of the film substrate in the thickness direction.

It is preferable that the conductive material layer is formed of gold, and a thickness of the conductive material layer is in a range of 10 nm to 50 nm. It is preferable that the conductive material layer is a member formed by a sputtering method. A gel layer or an elastomer layer may be provided on a film substrate surface on the other side of the film substrate.

According to the present invention, conductivity in the surface direction is exhibited, visible light is transmitted, deformation is freely performed, and durability is excellent.

DESCRIPTION OF THE PREFERRED EMBODIMENTS

First Embodiment

Figure 1:
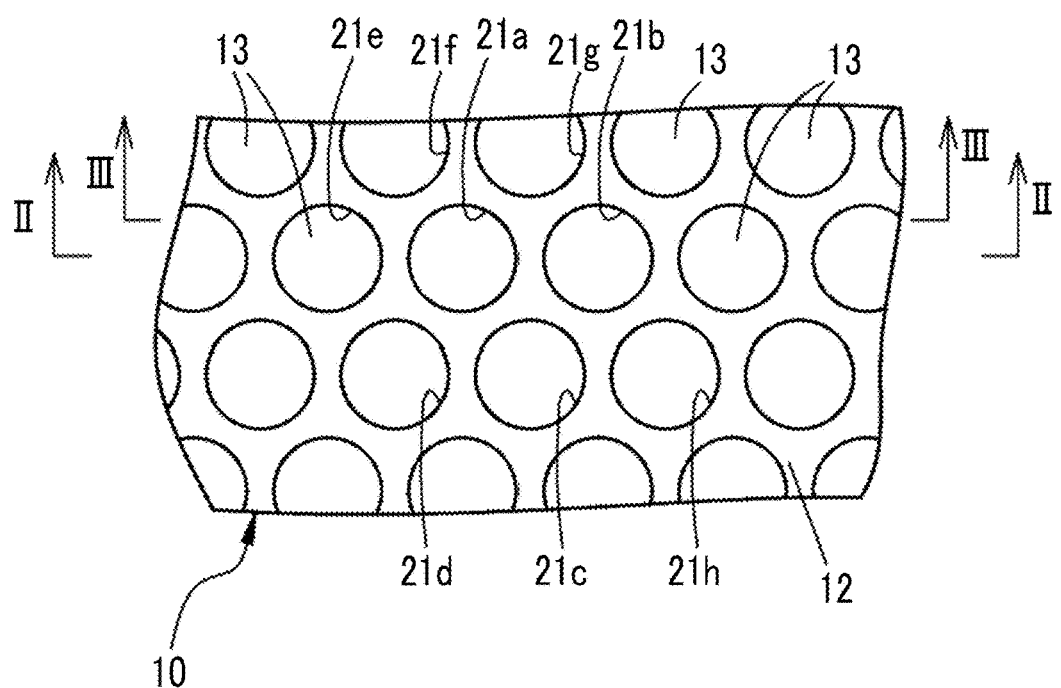
FIG. 1 is a schematic plan view of a conductive film of a first embodiment.
Figure 2:
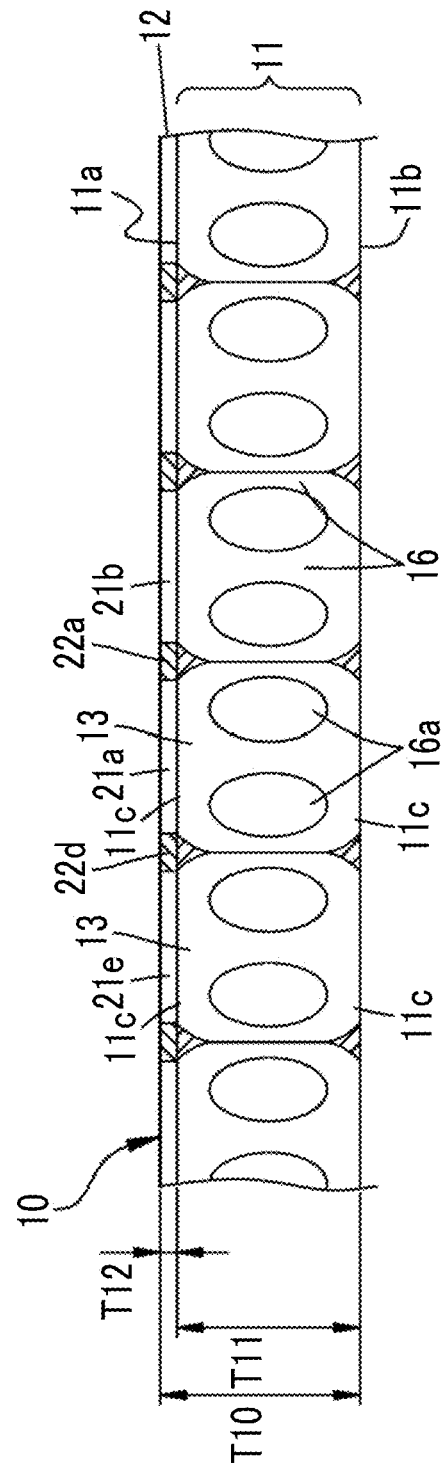
FIG. 2 is a cross section schematic view along line II-II of FIG. 1.
Figure 3:
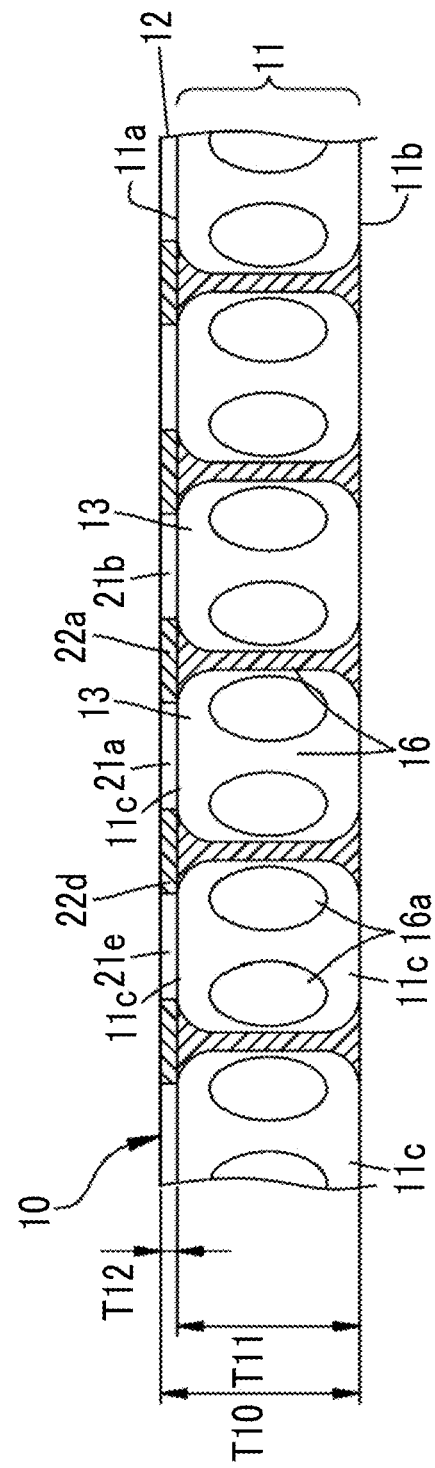
FIG. 3 is a cross section schematic view along line III-III of FIG. 1.

As illustrated in FIGS. 1 to 3, a conductive film 10 performing the present invention is formed in a mesh(net) shape, and a plurality of openings as a mesh are arranged in a planar (two-dimensional) manner. The conductive film 10 includes a film substrate 11 and a conductive material layer 12. The conductive material layer 12 is a member that forms one film surface on one side in a layer shape on one film substrate surface (hereinafter, referred to as a first substrate surface) 11a on one side of the film substrate 11 and is formed of a conductive material. FIG. 1 illustrates the conductive material layer 12 side of the conductive film 10, and FIGS. 2 and 3 exaggeratedly illustrate a thickness of the conductive material layer 12 with respect to the thickness of the film substrate 11. In a case where the conductive film 10 is bonded to a bonding target, the film substrate 11 comes into with a bonding target, and the conductive film 10 is arranged such that the conductive material layer 12 is exposed to the outside. The thickness of the conductive film 10 is the sum of a thickness T11 of the film substrate 11 and a thickness T12 of the conductive material layer 12 and is denoted by a reference symbol T10 in FIGS. 2 and 3.

A plurality of through holes 13 penetrating the film substrate 11 and the conductive material layer 12 in a direction vertical to the film surface, that is, in a thickness direction are formed in the conductive film 10. The plurality of through holes 13 are formed along the surface of the conductive material layer 12 as illustrated in FIG. 1 and formed along the first substrate surface 11a in the film substrate 11 as illustrated in FIG. 2. These through holes 13 form opening portions respectively in the surface of the conductive material layer 12 and the first substrate surface 11a and the film substrate surface on the other side (hereinafter, referred to as a second substrate surface) 11b of the film substrate 11. Opening portions in a surface of the conductive material layer 12 are referred to as layer opening portions below and are denoted by reference symbols 21a, 21b, 21c, . . . , 21h, . . . , and opening portions of the first substrate surface 11a and the second substrate surface 11b are referred to as substrate opening portions below and denoted by a reference symbol 11c. In FIG. 1, in order to avoid complication of the drawing, among the illustrated layer opening portions 21, only eight of the layer opening portions 21a, 21b, . . . , and 21h are denoted by reference symbols, and are referred to as the layer opening portions 21, in a case where these are not distinguished in the subsequent description. Each diameter of the layer opening portions 21 and the substrate opening portions 11c in the present embodiment is 5 μm.

The sizes and the shapes of the plurality of through holes 13 are mostly constant. As illustrated in FIG. 1, in a case where the plurality of through holes 13 are seen in a direction vertical to the film surface on the conductive material layer 12 side, the through holes 13 are densely arranged in a state in which the adjacent six through holes 13 are arranged at each vertex of a hexagon about one optional hole of the through holes 13.

The film substrate 11 is formed in a mesh shape by the plurality of through holes 13. It is preferable that the plurality of through holes 13 are regularly arranged along the first substrate surface 11a, and specifically, are arranged in a matrix shape. The respective sizes and the respective shapes of the substrate opening portion 11c are mostly constant.

In a case where such a film substrate 11 is seen in a direction vertical to the first substrate surface 11a, the through holes 13 are formed in the same manner as in a state of being arranged in the film surface on the conductive material layer 12 side as illustrated in FIG. 1, and thus the film substrate 11 has a honeycomb-like structure. This "honeycomb-like structure" is described below.

It is preferable that the thickness of a partition 16 between the adjacent through holes 13 gradually decreases as it goes toward the center in the thickness direction from each of the first substrate surface 11a and the second substrate surface 11b in the film substrate 11 as illustrated in FIGS. 2 and 3.

In this example, as illustrated in FIG. 2, the partition 16 has a partition wall opening portion 16a formed almost in the center in a thickness direction of the film substrate 11, and accordingly, the adjacent through holes 13 are connected to each other through the partition 16 inside the film substrate 11 in the direction along the first substrate surface 11a. Here, the partition wall opening portion 16a may not be formed in the partition 16, and in this case, the through holes 13 are independent to each other.

In the honeycomb-like structure, a shape of the substrate opening portion 11c and/or a shape of a cross section parallel to the first substrate surface 11a of the through hole 13 is not necessarily hexagon. In this example, the shape of the substrate opening portion 11c becomes a circular shape. According to the density of the through holes 13 per unit area of the first substrate surface 11a and/or the distance between the adjacent through holes 13, each of the shapes of the substrate opening portion 11c and the through holes 13 of the first substrate surface 11a may be, for example, a rounded substantially hexagonal shape or a rounded substantially octagonal shape, and the honeycomb-like structure includes such an aspect. The honeycomb-like structure includes a structure in which the adjacent through holes 13 are connected to each other inside the film substrate 11, as in this example, in addition to the structure in which the through holes 13 are independent to each other. The arrangement of the through holes 13 is not limited to the above. Three to five through holes 13 or seven or more through holes 13 may be arranged around one optional through hole 13, and the through holes 13 may be arranged in a square.

The thickness T11 of the film substrate 11 is preferably in the range of 0.2 μm to 20 μm and is 4 μm according to the present embodiment. The thickness T11 may be obtained by observing a cross section shape with a scanning electron microscope and performing measurement in this image, and this method is also used in the present embodiment. The thickness T11 is more preferably in the range of 0.5 μm to 15 μm and even more preferably in the range of 1.0 μm to 10 μm.

The film substrate 11 includes a hydrophobic polymer 52 (see FIG. 14) that is transparent, specifically, transmits visible light. As the hydrophobic polymer 52 that transmits visible light with high transmittance, polylactic acid, polycaprolactone, polyglycolic acid, polydioxanone, polyhydroxybutyrate, polybutadiene, polyurethane, polystyrene, polymethylmethacrylate, polycarbonate, a copolymer containing these repeating units, and a rubber-based polymer having stretchability and/or elastic properties are preferable. Examples of the rubber-based polymer material include polybutadiene, polyisoprene, polydimethylsiloxane derivative, and polyisobutylene. According to the present embodiment, polybutadiene is used as a hydrophobic polymer. A surfactant (amphipathic compound) may be included in the film substrate 11, as long as the content thereof is 10 mass % or less with respect to the mass of the film substrate 11. Since the film substrate 11 is freely deformed and is caused to exhibit durability with respect to repeating deformation, it is more preferable that the conductive film 10 is formed of any one of polybutadiene, polyisoprene, polydimethylsiloxane derivative, and polyisobutylene.

Figure 4:
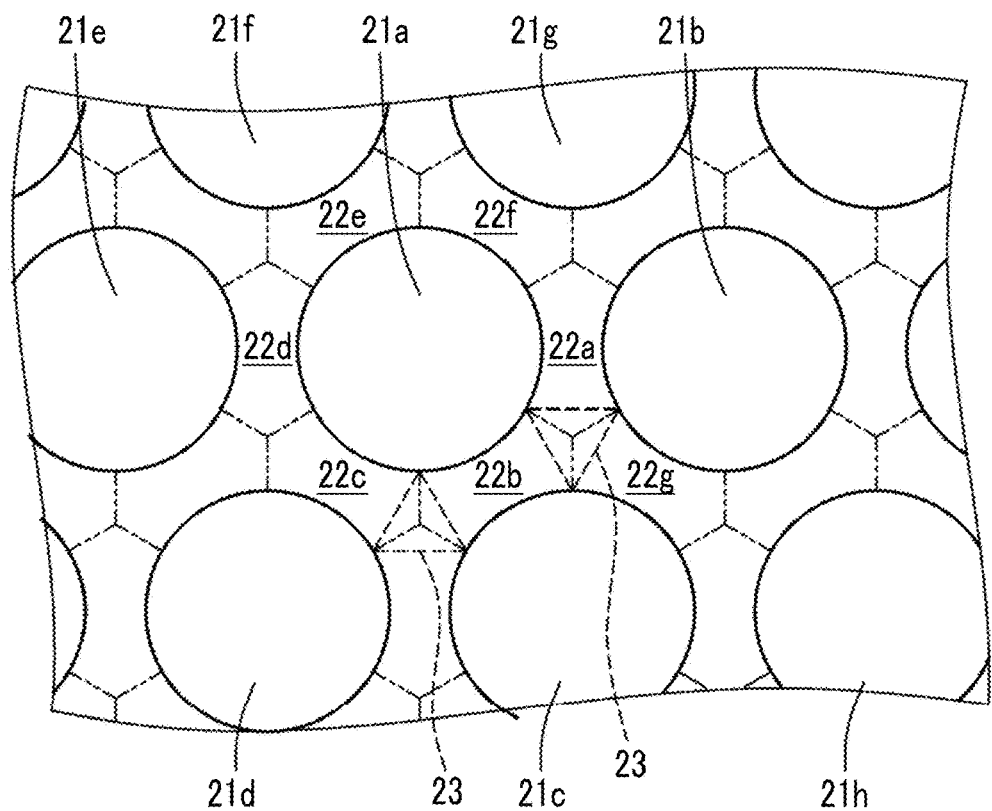
FIG. 4 is an explanatory view of a conductive portion.

The film substrate 11 is overlapped with the conductive material layer 12 in a state of not blocking the layer opening portions 21, and the conductive material layer 12 is arranged on the film substrate 11 in a state of not blocking the substrate opening portion 11c. As illustrated in FIG. 4, the conductive material layer 12 has a plurality of conductive portions 22a, 22b, . . . , 22g, and the like formed of a conductive material. In the subsequent description, in a case where the conductive portions 22a, 22b, . . . , 22g, and the like are not distinguished, the conductive portions are referred to as the conductive portions 22. In FIG. 4, in order to avoid complication of the drawing, among the illustrated conductive portions 22, only seven of the conductive portions 22a, 22b, . . . , and 22g are denoted by reference symbols.

Figure 5:
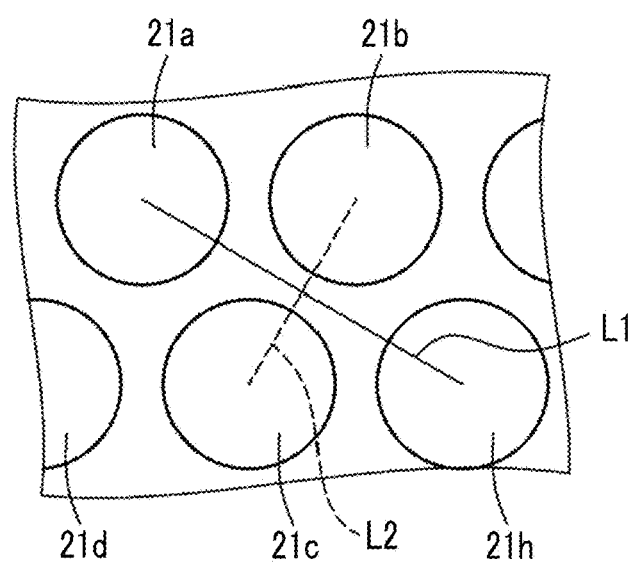
FIG. 5 is an explanatory view of a layer opening portion.

The conductive portions 22 are present in line between the adjacent layer opening portions 21 in a case where the conductive film 10 is seen in a direction vertical to the film surface on the conductive material layer 12 side. In this example, as illustrated in FIG. 4, layer opening portions adjacent to the layer opening portion 21a are six layer opening portions denoted by reference symbols 21b to 21g, and the conductive portions 22a to 22f are present between each of the layer opening portions 21b to 21g and the layer opening portion 21a. In a case where centers of the plurality of layer opening portions 21 in a case of being seen in the direction vertical to the film surface on the conductive material layer 12 side are connected to each other via line segments and the line segments intersect to each other, the two layer opening portions 21 connected to each other via one shorter line segment are set as "adjacent layer opening portions" on one side of the two layer opening portions 21 connected to each other via the other longer line segment. For example, in a case of determining which of the layer opening portions 21b, 21c, and 21h is a layer opening portion adjacent to the layer opening portion 21a, as illustrated in FIG. 5, first, centers of the layer opening portions 21a and 21h are connected to each other via a line segment L1 indicated as a solid line, and centers of the layer opening portions 21b and 21c are connected to each other via a line segment L2 indicated as a dashed line. The line segments L1 and L2 intersect with each other, and the line segment L2 is shorter than the line segment L1. Accordingly, layer opening portions adjacent to the layer opening portion 21a are the layer opening portions 21b and 21c, and the layer opening portions 21h is not a layer opening portion adjacent to the layer opening portion 21a.

The adjacent conductive portions 22 are connected to each other at end portions, and accordingly, conductive paths are formed in the surface direction of the conductive film 10. A connecting portion between an end portion of at least one of the conductive portions 22 and an end portion of at least one of the other conductive portions 22, that is, a connection point (hereinafter, referred to as a "connection point") in which the conductive portions 22 are connected to each other is denoted by a reference symbol 23. Each of the layer opening portions 21 is surrounded by the plurality of conductive portions 22 connected to each other at end portions, and in this example, in a case of paying attention to one layer opening portion 21a, this layer opening portion 21a is surrounded by six conductive portions 22a to 22f. Three conductive portions 22 are connected to each other at each connection point 23.

In the conductive material layer 12, in a case where the conductive film 10 is seen from the film surface side on one side of the conductive material layer 12 side, the number of the conductive portions 22 is at least 400 per area of 1 mm², that is, 400 or more, and according to the present embodiment, the number is 42,000. The number of the conductive portions 22 is more preferably in the range of 400 to 400,000 per area of 1 mm², even more preferably in the range of 1,000 to 200,000, and particularly preferably in the range of 2,000 to 100,000. The number of the conductive portions 22 per area of 1 mm$^2$, for example, may be obtained by using an image by a general optical microscope.

In the conductive material layer 12, in a case where the conductive film 10 is seen from the film surface side on one side of the conductive material layer 12 side, an opening ratio is at least 40%, that is, 40% or more, and according to the present embodiment, the opening ratio is 70%. This opening ratio may be obtained by using an image by a scanning electron microscope. Specifically, in a case where one side in a case where this image is a rectangle is set as x, the other side is y, a radius of the layer opening portion 21 is set as r, and the number of the layer opening portions 21 in an area (xy which is a product of x and y) of the image is set as n, the opening ratio is a percentage obtained from an expression of $(\pi r^2 n/xy) \times 100$ and is obtained by using an image of FIG. 12 described below, according to the present embodiment. The opening ratio of the conductive material layer 12 is more preferably in the range of 40% to 90%, even more preferably in the range of 45% to 80%, and particularly preferably in the range of 50% to 70%.

In addition to the first substrate surface 11a, the conductive material layer 12 may be formed on the surface of the partition 16. In view of causing the conductive film 10 to be more deformable, specifically, in view of causing the conductive film 10 to be bent with a smaller curvature, to be elongated in a greater expansion rate, and to be easily reverse from the bent state and/or the elongated state to the original state, it is preferable that the conductive material layer 12 is not formed on the surface of the partition 16, and even in a case where the conductive material layer 12 is formed, it is preferable that an area is smaller.

The thickness T12 of the conductive material layer 12 is slightly different from the range preferable for the conductive material forming the conductive material layer 12, and in a case where the conductive material is gold (Au) as described below, the thickness T12 is preferably in the range of 10 nm to 50 nm, and the thickness T12 according to the present embodiment is 23.200 nm. The thickness T12 is more preferably in the range of 15 nm to 40 nm and even more preferably in the range of 20 nm to 30 nm. The conductive film 10 is embedded in an epoxy resin, sections are manufactured with Ultramicrotome (UC 6, Leica Microsystems Co., Ltd.), the thickness T12 may be obtained from an image of this section by a transmission electron microscope (H-7650, manufactured by Hitachi Ltd.), and this method is used in the present embodiment. According to the present embodiment, specifically, the thicknesses are measured at 10 positions with respect to the sections, 10 measured values are obtained, and then an average value of the 10 measured values is set as the thickness T12.

Figure 6:
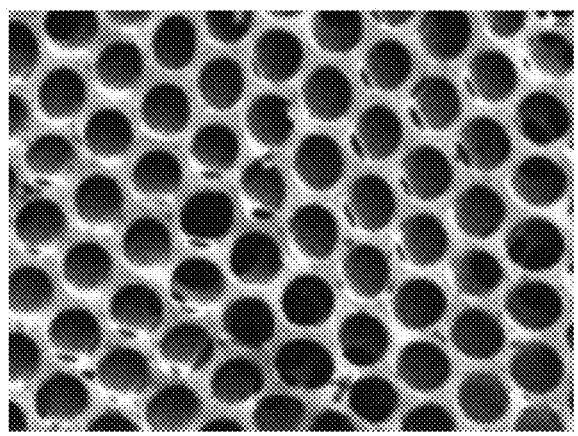
FIG. 6 is a scanning electron microscope image of the conductive film using gold in a conductive member.
Figure 7:
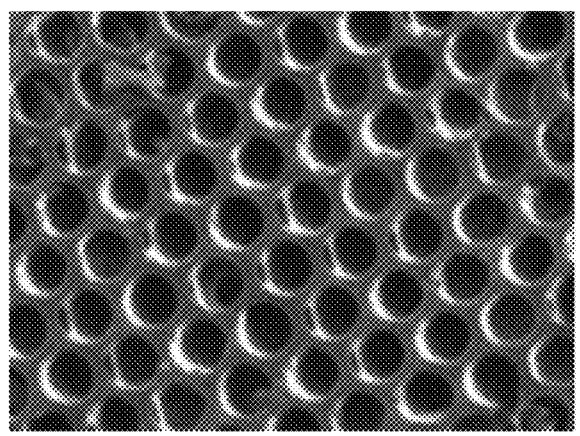
FIG. 7 is a scanning electron microscope image of the conductive film using titanium in the conductive member.
Figure 8:
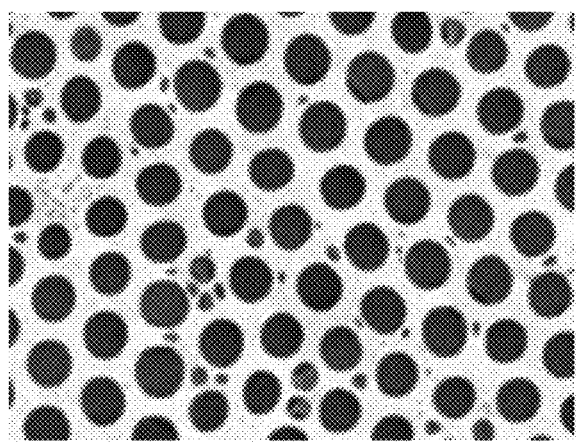
FIG. 8 is a scanning electron microscope image of the conductive film using platinum in the conductive member.

According to the present embodiment, as the conductive material forming the conductive material layer 12, gold (Au) is used (see FIG. 6), and the present invention is not limited thereto. Examples thereof may include titanium (Ti) (see FIG. 7), platinum (Pt) (see FIG. 8), silver (Ag), copper (Cu), nickel (Ni), and palladium (Pd). In a case where the thickness T12 is formed in the same manner, in view of exhibiting high conductivity and in view of stretching the conductive film 10 at a great expansion rate and durability with respect to the repeating deformation, among the conductive materials, gold, titanium, and platinum are more preferable. Among these, gold is particularly preferable.

The conductive material layer 12 may be a member (hereinafter, referred to as a heating vapor deposition member) formed by a heating vapor deposition method, and is preferably a member (hereinafter, referred to as a sputtering forming member) formed by a sputtering method, and a sputtering forming member according to the present embodiment.

The operation of the above configuration is described. The conductive material layer 12 is provided on the first substrate surface 11a of the film substrate 11 having a mesh shape, that is, a honeycomb-like structure in this example, and an opening ratio of the layer opening portion 21 is at least 40%, and the conductive film 10 exhibits high transmittance (hereinafter, simply referred to as transmittance) of visible light.

The evaluation results of transmittance are provided in Table 1. The transmittance is measured by using a spectrophotometer (V-670, JASCO Ltd.) equipped with a detection unit with an integrating sphere. Specifically, the transmittance is obtained by obtaining a diffusion reflectance of the conductive film 10 with respect to a wavelength region of from 350 nm to 700 nm as a visible light range and then subtracting the diffusion transmittance from 100%. As illustrated in Table 1, in a case where the thickness T12 of the conductive material layer 12 becomes thick, the conductive film 10 exhibits high transmittance. In Table 1, a case where the "thickness of the conductive material layer" is 0 nm is transmittance of a single body of the film substrate 11.

TABLE 1

| Thickness of conductive material layer [nm] | Transmittance [%] |
| --- | --- |
| 0 | 93.15 |
| 13 | 92.72 |
| 23 | 92.70 |
| 32 | 92.65 |
| 37 | 92.12 |
| 42 | 91.08 |

Figure 9:
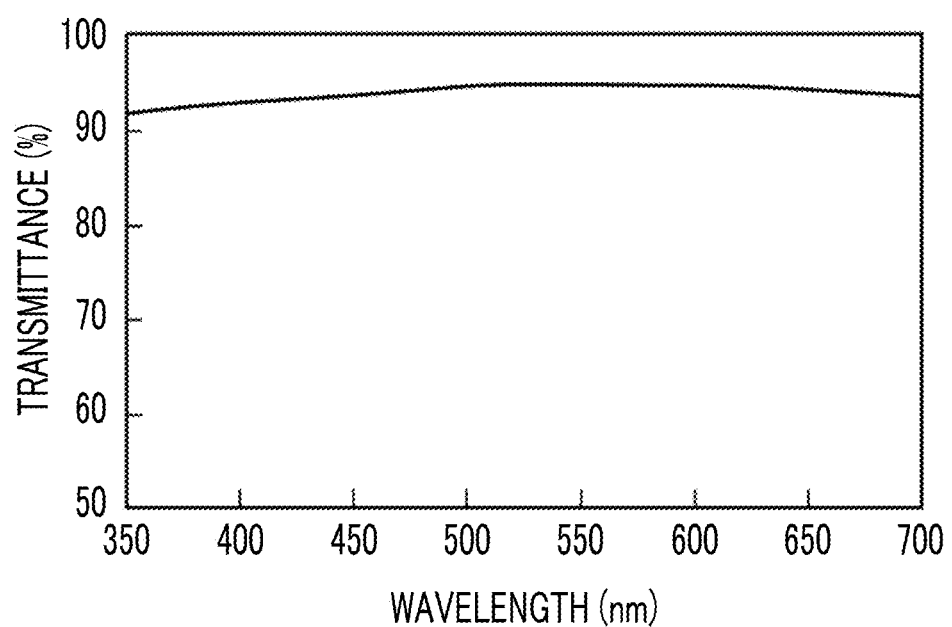
FIG. 9 is a graph representing transmittance of the conductive film with respect to a wavelength of light.

The transmittance of the conductive film 10 has low wavelength dependency of light, and, as illustrated in FIG. 9, with respect to the wavelength in the range of 350 nm to 700 nm, the transmittance of 92% or more is mostly exhibited. According to the present embodiment, the transmittance (unit is %) with respect to the wavelength of light is measured by using a spectrophotometer (V-670, JASCO Ltd.) equipped with a detection unit with an integrating sphere. Specifically, after the diffusion reflectance of the conductive film 10 with respect to the wavelength region of from 350 nm to 700 nm is obtained, the diffusion transmittance is obtained, and the diffusion reflectance is subtracted from 100%.

Since the film substrate 11 is formed in a mesh shape by the plurality of through holes 13, compared with a film substrate in which the through holes 13 are not formed, a film substrate formed in a state in which a plurality of holes are open only on the film substrate surface on one side, and a film substrate in which a plurality of holes are not open on both film substrate surfaces and are sealed inside as cavities, the film substrate 11 may be bent at a smaller curvature, may elongate at a greater expansion rate, may be twisted, and may be easily reversed from a bent state, an elongated state, and a twisted state to an original state. Therefore, the conductive film 10 is deformable. For example, in a case where the surface shape may be a curved surface such as a tissue surface of a living body, the form thereof is changed to follow the shape thereof, and thus the surface is closely attached, for example, to a dry bonding target. In a case of being bonded, the conductive film 10 deforms to follow the bending and/or expansion and contraction, twist, and the like of the bonding target and exhibits durability to repeating deformation.

The through holes 13 penetrate the film substrate 11 in the thickness direction and form the substrate opening portion 11c on the second substrate surface 11b, and the second substrate surface 11b is smoothly formed except for the substrate opening portion 11c. Therefore, for example, in a case where the second substrate surface 11b is closely attached to a bonding target including liquid such as water, the conductive film 10 securely maintains the closely attached state by the capillary force in the through holes 13.

The thickness of the partition 16 gradually decreases as it goes toward the center in the thickness direction of the film substrate 11. Therefore, compared with a case where the thickness is constant in the thickness direction of the film substrate 11, the conductive film 10 becomes more deformable, and the durability with respect to the repeating deformation is more excellent. Since the partition wall opening portion 16a is formed in the partition 16, compared with a case where a partition wall opening portion is not formed, the conductive film 10 becomes more deformable and has more excellent durability with respect to the repeating deformation.

Since the plurality of through holes 13 are regularly arranged along the first substrate surface 11a, the stress during deformation is evenly applied in the surface direction of the film substrate 11, and the local stress concentration is suppressed. Therefore, even in the conductive material layer 12 on the first substrate surface 11a, local stress concentration is suppressed, and a conductive path with the higher accuracy is maintained during deformation. According to the maintenance of this conductive path, conductivity on the entire film surface of the conductive film 10 is secured. Accordingly, in the conductive film 10, deformable properties and the durability with respect to the repeating deformation are more secured, and this secureness increases by causing the film substrate 11 to have a honeycomb-like structure.

Since the case where the thickness T11 of the film substrate 11 is 0.2 µm or more, compared with a case of less than 0.2 µm, the conductive film 10 has high strength and has self-supporting properties without being broken during expansion and contraction deformation. Since the thickness T11 is 20 µm or less, compared with a case where the thickness is more than 20 µm, the form is changed to follow the surface shape of the bonding target and follows the deformation of the surface shape of the bonding target, such that the closely attached state is securely maintained. Even in a case where the conductive film 10 is as thin as 20 µm or less, according to the above configuration of the film substrate 11, the conductive film 10 is hardly broken even in a case of being deformed and exhibits durability with respect to the repeating deformation.

The conductive material layer 12 is provided on the first substrate surface 11a of the film substrate 11, the conductive film 10 exhibits conductivity in the surface direction by forming the conductive path obtained by the connection between the conductive portions 22, and conductivity is exhibited on the entire film surface. Since the number of the conductive portions 22 that are connected to each other via the connection point 23 is set as 3 in the present embodiment, according to the deformation of the conductive film 10, even in a case where one of the conductive portions 22 is broken or a pair of the conductive portions 22 connected to each other is separated, the conductive path is secured by the connection between the remaining conductive portions 22 and/or the other conductive portions 22. In a case where the conductive film 10 is seen from the film surface on one side of the conductive material layer 12 side, the number of the conductive portions 22 per area of 1 mm$^2$ is as extremely great as at least 400, and the conductive portions 22 are very densely present. Therefore, as the deformation of the conductive film 10, for example, even in a case where some of the conductive portions 22 are broken, the conductive path is secured by the other conductive portions 22, and thus conductivity is maintained.

The thickness T12 of the conductive material layer 12 formed of gold (Au) is 10 nm or more, and thus, even in a case where the conductive film 10 is deformed, conductivity is more securely maintained. Since the thickness T12 is 50 nm or less, compared with the case where the thickness is more than 50 nm, even in a case where the conductive film 10 is stretched at a greater expansion rate, the conductivity is more securely maintained.

Figure 10:
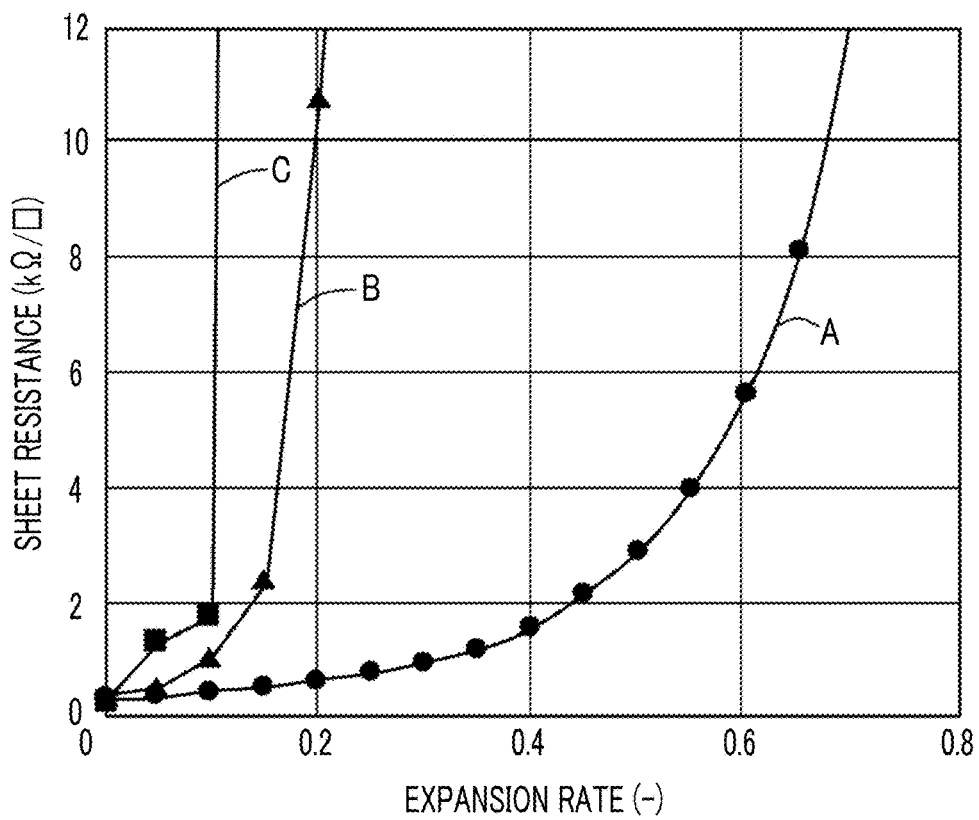
FIG. 10 is a graph representing a relationship between an expansion rate and a sheet resistance with respect to conductive films having conductive members with different thicknesses.

The conductivity in the surface direction may be evaluated by the sheet resistance. According to the present embodiment, the sheet resistance is calculated by using a resistance value R of the conductive film 10 having the width of 1 cm and the length of 3 cm and by using the expression of R×w/L. The resistance value R of the conductive film 10 is calculated from Ohm's law (V=IR) by applying a constant voltage of 1 V on both ends of the conductive film 10 having the above size in the longitudinal direction and measuring the current flowing during the application. The current is measured using an ALS electrochemical analyzer manufactured by BAS Inc. In a case where the length in the state before the expansion is set as L1 and the length in the state after the expansion is set as L2 in one direction, the expansion rate is a value obtained by (L2−L1)/L1. The sheet resistance of the conductive film 10 of the present embodiment in which the thickness T12 of the conductive material layer 12 is 23.200 nm seldom changes in a case where the expansion rate is 0.2 or less as indicated by a curve line A (measured value is indicated by •) of FIG. 10 and is suppressed to be less than 6 kΩ/□ even in a case where the expansion rate is 0.6. All of the sheet resistances in FIG. 10 are obtained in the expansion state except for the case where the expansion rate is 0, the sample used in the measurement includes a gel member having a thickness of 500 µm on the second substrate surface 11b of the film substrate 11 of the conductive film 10. The gel member is polydimethylsiloxane (PDMS). "kΩ/□" used as a unit of the sheet resistance in the present specification as described above means "kΩ/square" and is "kΩ" in the SI unit system.

The degree of the conductivity maintained with respect to the expansion rate is different according to the thickness T12 of the conductive material layer 12. A curve line B (measured value is indicated by ▲) of FIG. 10 is the sheet resistance in a case where the thickness T12 is 34.600 nm, and a curve line C (measured value is indicated by ■) is the sheet resistance in a case where the thickness T12 is 42.100 nm. The conductive portions 22 are broken at the expansion rates of about 0.2 and about 0.1, respectively, and the sheet resistances greatly increase. This is because the conductive material layer 12 is caused to have a hard film shape by increasing the thickness T12, and is caused to be easily broken to the elongation. In a case where the conductive material forming the conductive material layer 12 is gold (Au), as the thickness T12 becomes thinner in the range of 10 nm to 50 nm, the conductivity with respect to the expansion rate becomes excellent. Accordingly, the conductivity with respect to the expansion rate may be changed by adjusting the thickness T12 according to the conductive material.

Figure 11:
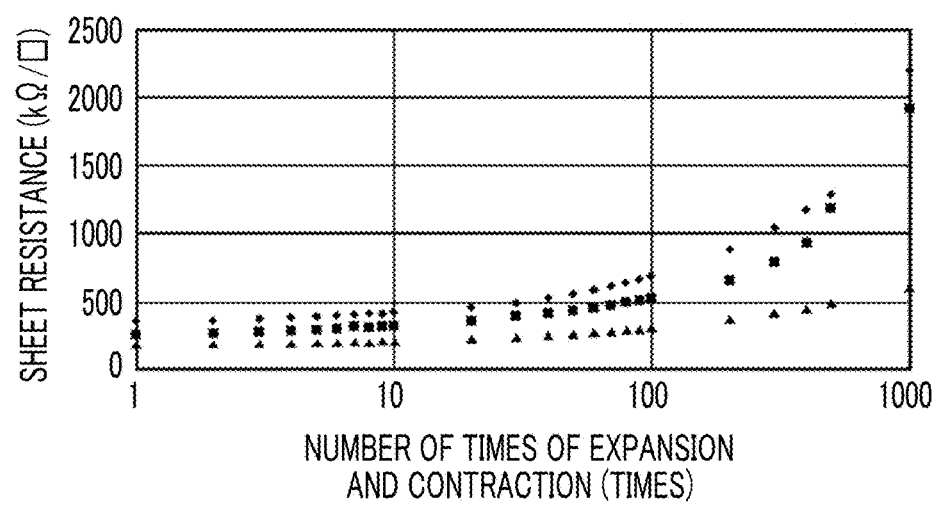
FIG. 11 is a graph representing a relationship between the sheet resistance and the number of times of expansion and contraction of the conductive films.

As illustrated in FIG. 11, the sheet resistance of the conductive film 10 hardly changes in a case where the number of times of the expansion and contraction is 100 or less, and even in a case where the number of times of the expansion and contraction is 1,000, the sheet resistance is suppressed to be about 2,200Ω/□. Particularly, even in a case where the number of times of the expansion and contraction is set as 1,000 in a case where the expansion rate indicated by ▲ is 0.3, the sheet resistance is suppressed to be about 600Ω/□. The conductive film is stretched at a predetermined expansion rate in a predetermined direction, a treatment of releasing this stretching force is repeated, the last stretching is completed, and each of the respective sheet resistances indicated in FIG. 11 is measured in a state in which the stretching force is released. ♦ indicates a case where the expansion rate is 0.5, and ■ indicates a case where the expansion rate is 0.4. The sample used in the measurement is one in the same aspect as the sample used for measuring the sheet resistance illustrated in FIG. 10.

Figure 12:
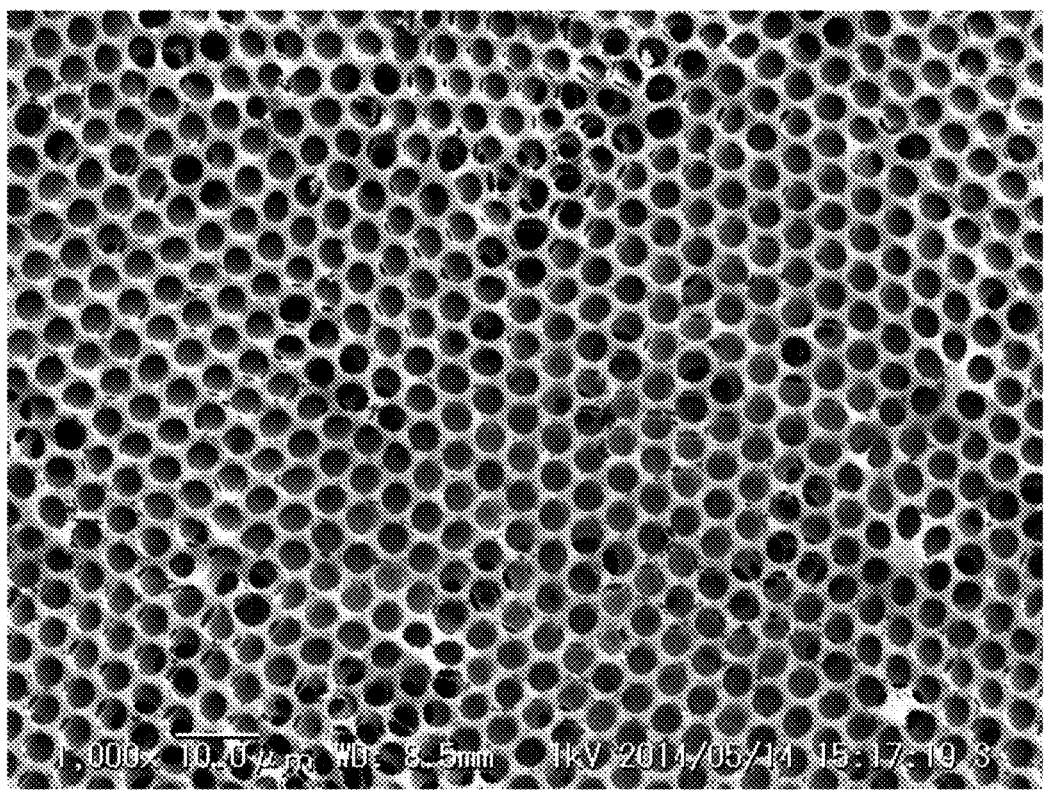
FIG. 12 is a scanning electron microscope image of a conductive material layer formed by a sputtering method.
Figure 13:
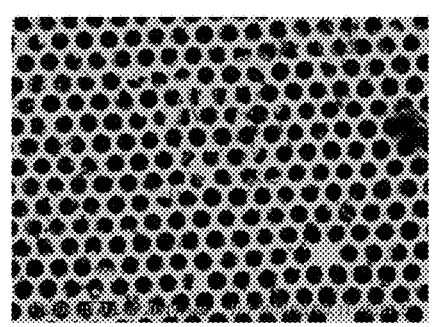
FIG. 13 is a scanning electron microscope image of a conductive material layer formed by a heating vapor deposition method.

The conductive material layer 12 is a sputtering forming member (see FIG. 12), and for example, the thickness is more uniform over a wider range than a heating vapor deposition member (see FIG. 13) or an electroless plating member formed by electroless plating. Therefore, during the deformation of the conductive film 10, breaking of the conductive portions 22 and/or the separation between the conductive portions 22 are securely suppressed. As illustrated in FIGS. 12 and 13, it is more preferable that the conductive material layer 12 is caused to be a sputtering forming member, compared with a case of being a heating vapor deposition member, since the substrate opening portion 11c of the film substrate 11 is formed without being more securely blocked.

Figure 14:
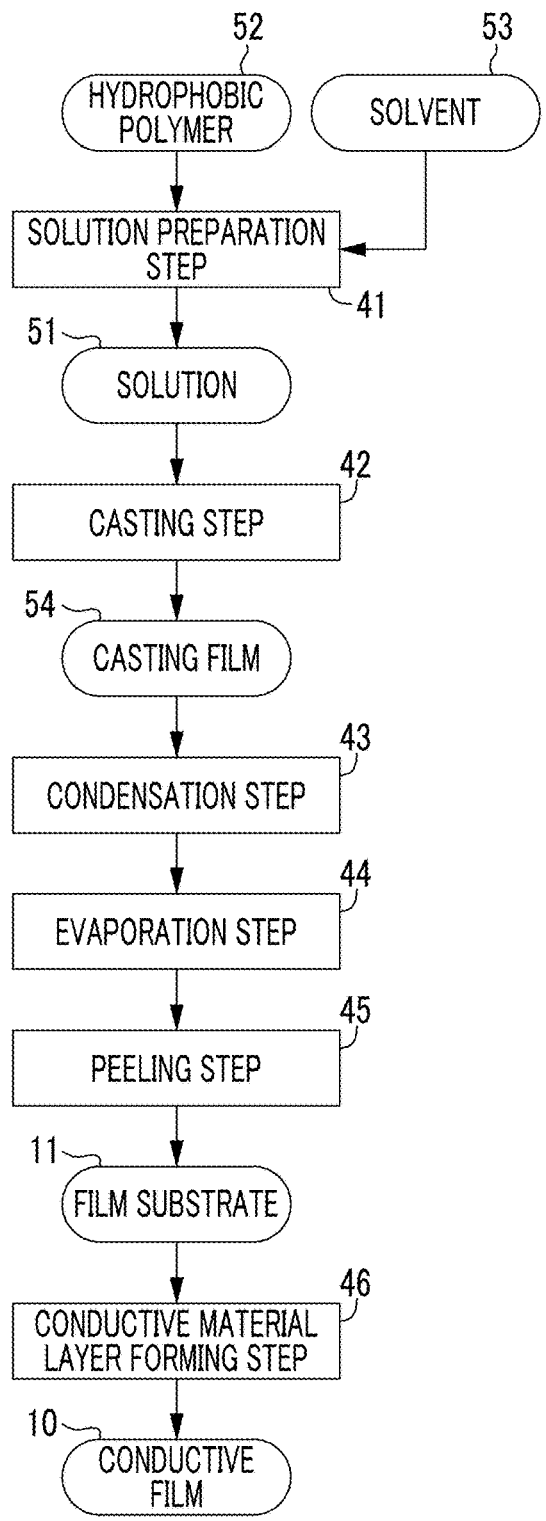
FIG. 14 is an explanatory view illustrating a step of manufacturing a conductive film.

The conductive film 10 is manufactured, for example, by the conductive film manufacturing step illustrated in FIG. 14. The conductive film manufacturing step has a solution preparation step 41, a casting step 42, a condensation step 43, an evaporation step 44, a peeling step 45, and a conductive material layer forming step 46.

The solution preparation step 41 is a step of preparing a solution 51 in order to form the film substrate 11. In this example, the hydrophobic polymer 52 is dissolved in a solvent 53, so as to obtain the solution 51. The casting step 42 is a step of flowing down and spreading the solution 51 onto a support (not illustrated), so as to form a casting film 54. It is preferable that the temperature of the support is adjusted in advance, and the temperature is also adjusted while the casting film 54 is formed. The solvent 53 is selected by the types of the hydrophobic polymer 52. In a case where various hydrophobic polymers 52 are used, for example, dichloromethane, chloroform, toluene, and normal hexane may be used singly or two or more kinds thereof may be used together, and the other liquid may be added to be used. As the solvent 53, for example, in a case where polybutadiene is used as the hydrophobic polymer 52, chloroform may be used singly, or a mixture using chloroform as a main component may be used.

The condensation step 43 is a step of forming water droplets on the film surface of the casting film 54 by condensation. The water droplet is formed by cooling the casting film 54 via a support such that such that the temperature thereof becomes the temperature lower than the temperature of the surrounding atmosphere. Here, in view of aligning the timings of generation of a plurality of water droplets or evenly aligning sizes of the formed water droplets, it is preferable that, while the temperature of the support is adjusted such that the support is maintained to have a predetermined temperature, humidified gas (for example, air) is supplied to the casting film 54.

The evaporation step 44 is a step of evaporating the water droplets formed in the condensation step 43 and the solvent 53. In this evaporation step 44, the solvent 53 more quickly evaporates than the water droplets. Accordingly, the water droplets are sunk into the casting film 54, and holes are formed using the sunk water droplets as molds. These holes become the through holes 13 in the obtained film substrate 11. Therefore, as the solvent 53, it is preferable to use one having a greater evaporation speed than water. Here, the timing at which the water droplets start to evaporate may not be after all of the solvent 53 is completely evaporated. As long as the formed holes are maintained, even after the water droplets are completely evaporated, the solvent 53 may slightly remain in the casting film 54, and in this case, the remaining solvent 53 is evaporated in a case where the evaporation of the water droplet is completed. In the condensation step 43, the water droplet starts to sink in the casting film 54, in some cases. The condensation step 43 and the evaporation step 44 are steps of a condensation method (also referred to as a Breath Figure method), which are well-known as the method of manufacturing a porous film having a honeycomb-like structure. In the peeling step 45, the casting film 54 is peeled off from the support as the film substrate 11.

The conductive material layer forming step 46 forms the conductive material layer 12 on the first substrate surface 11a of the film substrate 11 separated from the support. As the method of forming the conductive material layer 12, the heating vapor deposition method and the sputtering method may be used, but the sputtering method is more preferable, and the sputtering method is used in the present embodiment. In the sputtering method, for example, the film substrate 11 may be provided to a sputtering treatment device, in a state of being maintained in a frame (frame member) including having a holding device for setting the film substrate 11 in a sputtering apparatus. As in the present embodiment, in a case where the partition 16 gradually decreases toward the center of the film substrate 11 in the thickness direction, the sputtering method is preferable since the conductive material layer 12 is hardly formed on the surface of the partition 16 compared with the heating vapor deposition method.

Figure 15:
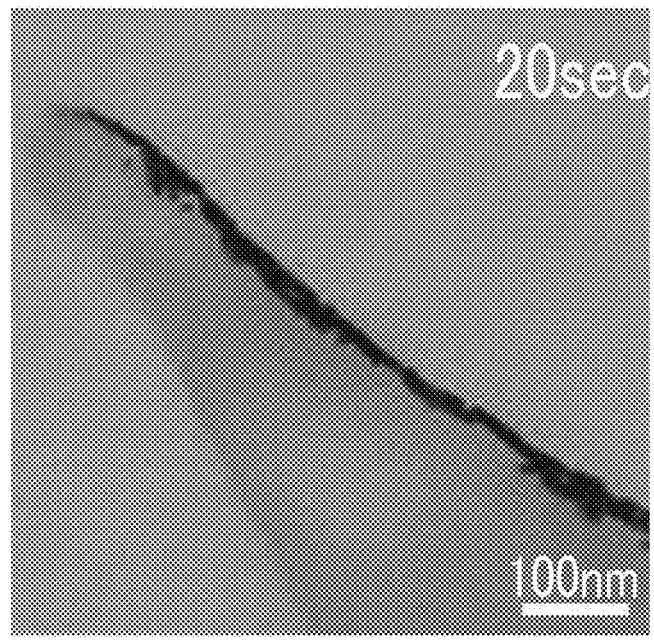
FIG. 15 is a transmission electron microscope image of a cross section of a conductive material layer formed for a sputtering time of 20 seconds.
Figure 16:
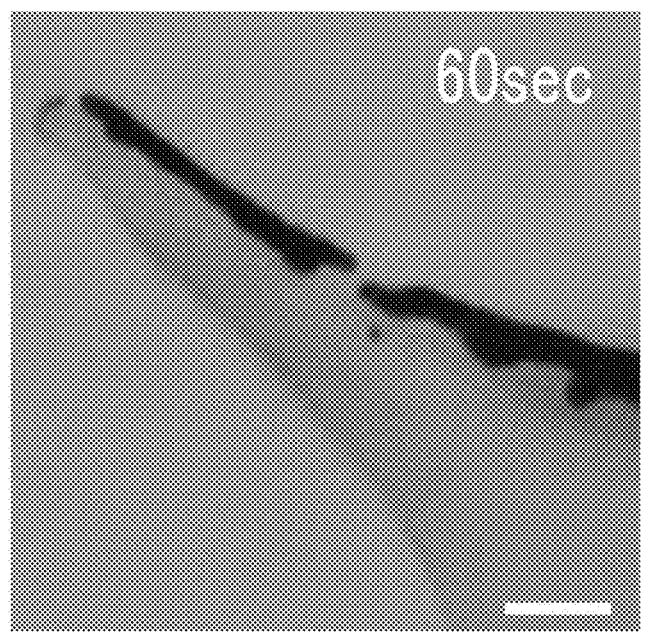
FIG. 16 is a transmission electron microscope image of a cross section of a conductive material layer formed for a sputtering time of 60 seconds.

In a case where the conductive material layer 12 is formed by the sputtering method, the thickness T12 of the conductive material layer 12 may be changed by changing the sputtering time. As presented in Table 2, as the sputtering time becomes longer, the thickness T12 may be caused to be thicker. In a case where FIGS. 15 and 16 with each other, the conductive material layer 12 obtained by setting the sputtering time to be 60 seconds is formed to be thicker than the conductive material layer 12 obtained by setting the sputtering time to be 20 seconds. FIGS. 15 and 16 are cross section images near the substrate opening portion 11c, a black portion is the conductive material layer 12, the lower left of each image is the inside of the through holes 13 in the film substrate 11, and the upper right is an external space of the conductive material layer 12. In FIGS. 15 and 16, the enlargement magnifications are equal to each other, and the length of the white line segment at the lower right in FIG. 16 corresponds to 100 nm as in FIG. 15. The image may be obtained by embedding the conductive film 10 to an epoxy resin, manufacturing a section with Ultramicrotome, and observing this section with a transmission electron microscope (H-7650, manufactured by Hitachi Ltd.). It is possible to adjust the thickness T12 by adjusting at least one of the sputtering time and the distance between a metal target and the film substrate 11.

TABLE 2

| Sputtering time [seconds] | Thickness of conductive material layer [nm] |
|---|---|
| 0 | 0 |
| 10 | 14.000 |
| 20 | 23.200 |
| 30 | 34.600 |
| 40 | 33.450 |
| 50 | 37.800 |
| 60 | 42.100 |

A commercially available sputtering film forming device may be used for forming the conductive material layer 12 by the sputtering method. In the present embodiment, a multi-target compact coater (SVC-700TMSG-NS, manufactured by Sanyu Electron Co., Ltd.) is used. The sputtering in the present embodiment is performed by setting the pressure in the chamber to 0.4 Pa, the DC voltage applied to the target metal to 320 V (the current is 22 mA), and the distance between the target metal and the film substrate 11 to 5 cm.

In the above example, the conductive material layer forming step 46 is performed after the peeling step 45, but the peeling step 45 may be performed after the conductive material layer forming step 46.

The opening ratio of the conductive material layer 12 and the number of the conductive portions 22 per area of 1 $mm^2$ may be changed by controlling the shape of the through holes 13 in the film substrate 11. The shape of the through holes 13 in the film substrate 11 may be controlled in the condensation step 43 and/or the evaporation step 44. Paragraphs [0017] and [0018] of JP2010-70648A, paragraphs [0032] to [0040] of JP2010-76105A, paragraphs [0009] and [0025] of JP2010-235808A, and the like disclose that the shape of the hole is controlled by controlling the temperature of the support and/or humidified gas and the growth time of the water droplets generated by condensation, and the methods disclosed in these documents may be applied to the condensation step 43 and/or the evaporation step 44.

The conductive film 10 according to the present embodiment in which each of the diameters of the layer opening portions 21 and the substrate opening portion 11c is 5 in, the opening ratio in the conductive material layer 12 is 70%, the thickness T11 of the film substrate 11 is 4 μm, and the number of the conductive portions 22 is 42,000 per 1 $mm^2$, is more specifically manufactured in the following method. First, the hydrophobic polymer 52 and an amphiphilic polymer compound as the surfactant are mixed in a mass ratio of 10:1, and this mixture is dissolved in the solvent 53, so as to prepare the solution 51 having the concentration of 2 mg/ml. Polybutadiene (manufactured by JSR Corporation) is used as the hydrophobic polymer 52, chloroform is used as the solvent 53, and the amphiphilic polymer compound is amphiphilic polyacrylamide represented by Formula (1). The casting film 54 is formed by coating a glass plate as a support provided on a cooling plate with the solution 51. The highly humidified air is supplied to the casting film 54. At this point, the temperature of the cooling plate is adjusted to 10° C., and the humidity of humidified air is adjusted such that the dew point becomes 18° C. The casting film 54 is dried and then peeled off from the glass plate, so as to obtain the film substrate 11. The conductive material layer 12 is applied to this film substrate 11 by using the sputtering method as above. Each of the diameters of the layer opening portions 21 and the substrate opening portion 11c, an opening ratio in the conductive material layer 12, the thickness T11 of the film substrate 11, and the number of the conductive portions 22 per 1 $mm^2$ are confirmed by using a microscope.

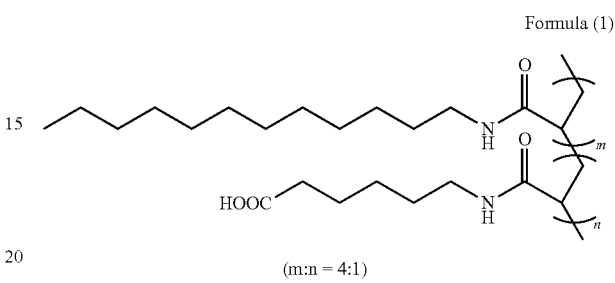

Formula (1)

(m:n = 4:1)

According to another aspect, the conductive film 10 in which each of the diameters of the layer opening portions 21 and the substrate opening portion 11c is 45 μm, the opening ratio in the conductive material layer 12 is 60%, the thickness T11 of the film substrate 11 is 20 μm, and the number of the conductive portions 22 is 480 per 1 $mm^2$, is more specifically manufactured in the following method. First, the hydrophobic polymer 52 and an amphiphilic polymer compound as a surfactant are mixed at a mass ratio of 10:1, and this mixture is dissolved in the solvent 53, so as to prepare the solution 51 having higher concentration than the solution 51 according to another aspect. Polybutadiene (manufactured by JSR Corporation) is used as the hydrophobic polymer 52, and the main component of the solvent 53 is chloroform. The casting film 54 is formed by coating a glass plate as a support provided on a cooling plate with the solution 51. The highly humidified air is supplied to the casting film 54. At this point, the temperature of the cooling plate is adjusted to 5° C., and the humidity of humidified air is adjusted such that the dew point becomes 20° C. The casting film 54 is dried and then peeled off from the glass plate, so as to obtain the film substrate 11. The conductive material layer 12 is applied to this film substrate 11 by using the sputtering method as above. Each of the diameters of the layer opening portions 21 and the substrate opening portion 11c, an opening ratio in the conductive material layer 12, the thickness T11 of the film substrate 11, and the number of the conductive portions 22 per 1 $mm^2$ are confirmed by using a microscope.

For example, in order to use the conductive film 10 as an electrode material, a predetermined pattern may be formed on the conductive material layer 12. According to the present embodiment, with respect to the conductive material layer 12 of the conductive film 10 obtained in the above method, a patterning process is performed by so-called laser ablation, and an electrode pattern is formed to prepare an electrode material. The prepared electrode material is provided on the convex side surface of a soft contact lens in a water-containing state placed on a glass ball. The area of the electrode material is approximately half the area of the soft contact lens, and the electrode material is arranged in the area half of one side the convex side surface. In a case where the film substrate 11 is disposed so as to be in contact with the soft contact lens, the electrode material closely attached to the soft contact lens. A conductive tester is manufactured by using a light emitting diode (LED), a power source, and a pair of terminals. This conductive tester is capable of confirming energization by turning on the LED. In the state in which the electrode material is closely attached to the soft contact lens, terminals are brought into contact with one end and the other end of the electrode pattern, respectively, and energization is confirmed by turning on the LED. In order to confirm the energization, a direct current voltage of 3 V is applied to turn on the LED. In this manner, the conductive film 10 functions as an electrode material in which one end is connected to the anode and the other end is connected to the cathode.

The film substrate is not limited to the film substrate 11 having a honeycomb-like structure, as long as the film substrate has a mesh shape. Examples of the mesh shape include a woven shape, a knitted shape, a nonwoven shape, and a sponge shape, and the conductive film including the film substrate and the conductive material layer in this manner has the same action as the conductive film 10 described above. The sponge shape means a porous shape in which a plurality of amorphous cavities are formed.

Second Embodiment

Figure 17A:
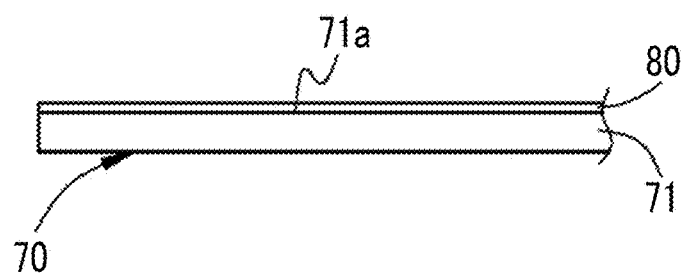
FIG. 17A is an explanatory view illustrating a layer structure of a conductive film of a second embodiment.

A conductive film 70 illustrated in FIG. 17A includes a film substrate 71 and a conductive material layer 80. The conductive material layer 80 is provided on a first substrate surface 71a of the film substrate 71 in an overlapped manner in a layer shape. A plurality of through holes 75 (see FIG. 17B) penetrating the film substrate 71 and the conductive material layer 80 in a thickness direction are formed in the conductive film 70, in the same manner as in the conductive film 10, but the illustration of the through hole 75 is omitted in FIG. 17A. In FIG. 17A, the conductive film 70 is schematically illustrated, and each of the film surfaces is illustrated to be flat for the sake of convenience.

Figure 17B:
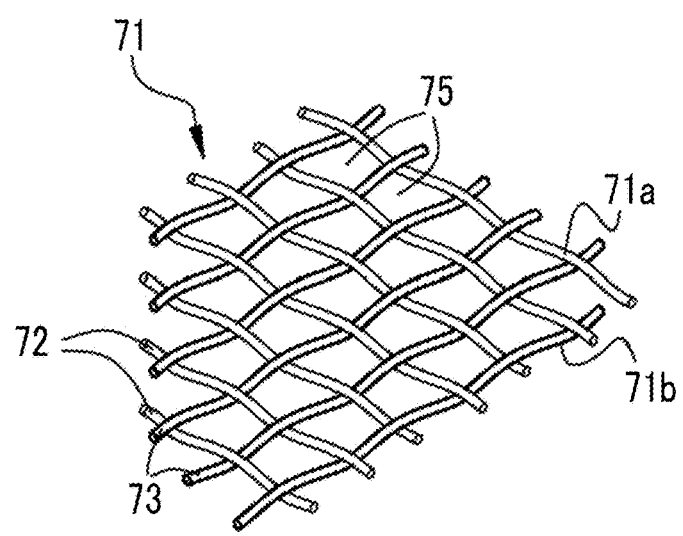
FIG. 17B is a schematic perspective view of a film substrate in the conductive film of the second embodiment.

As illustrated in FIG. 17B, the film substrate 71 is formed in a web shape woven with a plurality of first linear members 72 extending in the first direction and a plurality of second linear members 73 extending in the second direction orthogonal to the first direction. The first linear members 72 and the second linear members 73 are formed by the hydrophobic polymer. The through holes 75 surrounded by the first linear members 72 and the second linear members 73 have substrate opening portions in the first substrate surface 71a and a second substrate surface 71b.

The first linear members 72 and the second linear members 73 are independent to each other, and may be may be integrated by, for example, fusion welding and the like by heating. An intersecting angle between the first linear member 72 and the second linear member 73 is not limited to 90°. In this example, the distance between the adjacent first linear members 72 is caused to be constant, and the distance between the adjacent second linear members 73 is also caused to be constant. Accordingly, the plurality of through holes 75 are regularly arranged. Here, at least one of the distances between the adjacent first linear members 72 and the distance between the adjacent second linear members 73 may be caused to be inconstant.

Since the film substrate 71 is formed in a mesh shape, in the same manner as in the film substrate 11, compared with a film substrate in which the through holes 13 are not formed, a film substrate formed in a state in which a plurality of holes are open only on the film substrate surface on one side, and a film substrate in which a plurality of holes are not open on both film substrate surfaces and are sealed inside as cavities, the film substrate 11 may be bent at a smaller curvature, may elongate at a greater expansion rate, may be twisted, and may be easily reversed from a bent state, an elongated state, and a twisted state to an original state. Therefore, the conductive film 70 (see FIG. 17A) including the film substrate 71 and the conductive material layer 80 (see FIG. 17A) is deformable. For example, in a case where the surface shape may be a curved surface such as a tissue surface of a living body, the form thereof is changed to follow the shape thereof, and thus the surface is closely attached, for example, to a dry bonding target. In a case of being bonded, the conductive film 70 deforms to follow the bending and/or expansion and contraction, twist, and the like of the bonding target and exhibits durability to repeating deformation.

Figure 17C:
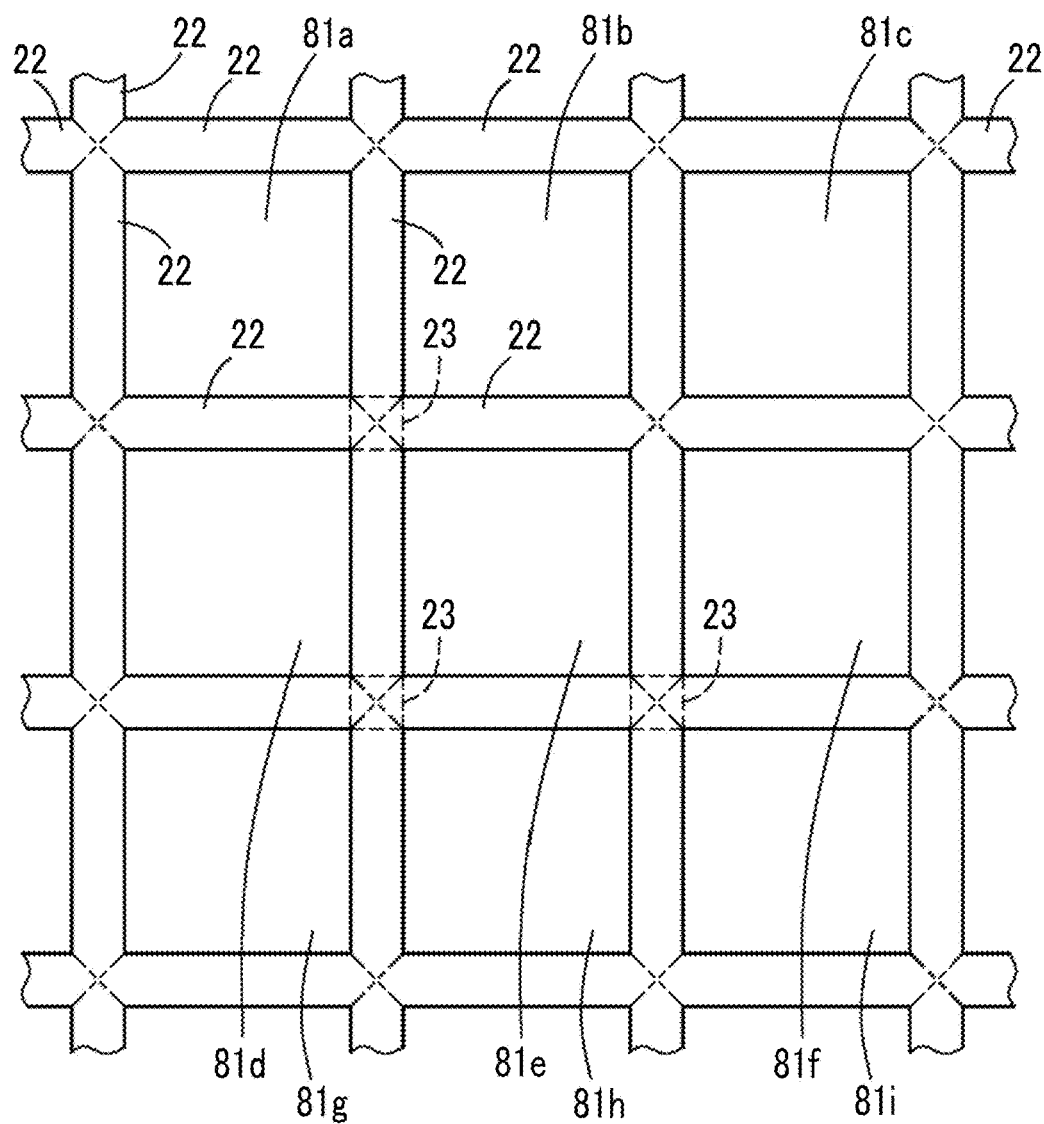
FIG. 17C is a schematic plan view of a conductive material layer in the conductive film of the second embodiment.

As illustrated in FIG. 17C, the conductive material layer 80 includes the conductive portions 22 on the surface on the first substrate surface 71a side of the first linear members 72 and the second linear members 73 that surround each of the through holes 75, and a plurality of layer opening portions 81a, 81b, 81c, and the like are formed. In the description below, in a case where these layer opening portions 81a, 81b, 81c, and the like are not distinguished from each other, the layer opening portions are referred to as the layer opening portions 81. The conductive portions 22 are present in a linear shape between the adjacent layer opening portions 81, and the adjacent layer opening portions 81 in this example mean the layer opening portions 81 adjacent to each other in a column direction (a vertical direction in FIG. 17C) and a row direction (a horizontal direction in FIG. 17C) in which the layer opening portions are arranged. For example, the layer opening portions adjacent to the layer opening portion 81e are four reference symbols 81b, 81d, 81f, and 81h, and the four reference symbols 81a, 81c, 81g, and 81i are not layer opening portions adjacent to the layer opening portion 81e. Accordingly, each of the layer opening portions 81 is surrounded by four of the conductive portions 22.

Also in this example, the opening ratio of the conductive material layer 80 is considered as at least 40%, and the conductive film 70 exhibits the high transmittance. In this example, four of the conductive portions 22 are connected to each other via one connection point 23. Therefore, as the deformation, for example, even in a case where some of the conductive portions 22 are broken, the conductive path is secured by the other conductive portions 22, and thus conductivity is maintained.

In the same manner as in the conductive material layer 12, in a case where the conductive material layer 80 is seen from the film surface side on one side of the conductive material layer 80 side, it is considered that the number of the conductive portions 22 is at least 400 per area of 1 mm$^2$. In this manner, since in the conductive material layer 12, the conductive portions 22 are formed at high density, as the deformation, for example, even in a case where some of the conductive portions 22 are broken, the conductive path is secured by the other conductive portions 22, and thus conductivity is maintained.

Third Embodiment

Figure 18:
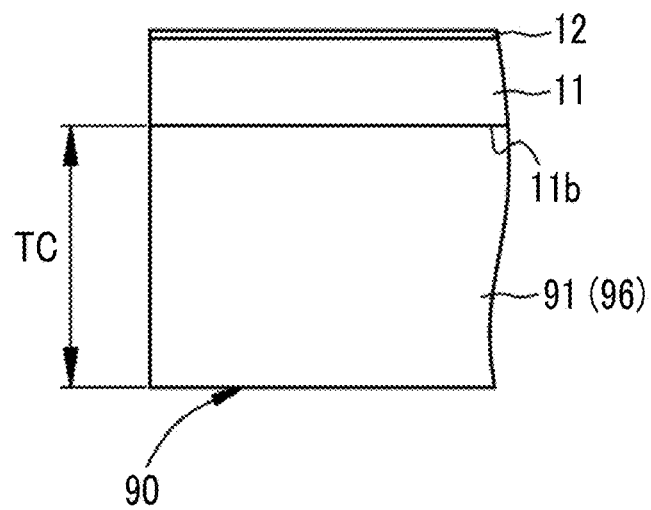
FIG. 18 is a schematic side view of a conductive film of a third embodiment.

With reference to FIG. 18, a conductive film 90 according to a third embodiment is described. In FIG. 18, the same members as illustrated in FIG. 1 are denoted by the same reference symbols as in FIG. 1, and the descriptions thereof are omitted. Also, in order to avoid complication of the drawing, the through holes 13 are not illustrated. The conductive film 90 includes the film substrate 11, the conductive material layer 12, and a gel layer 91. The gel layer 91 is provided on the second substrate surface 11b of the film substrate 11. The gel layer 91 covers the second substrate surface 11b so as to block the substrate opening portion 11c (not illustrated) formed on the second substrate surface 11b.

The gel layer 91 is to increase the adhesiveness to a bonding target. Accordingly, in a case where the conductive film 90 is bonded to a bonding target, the conductive film 90 is arranged such that the gel layer 91 comes into contact with the bonding target. Examples of the bonding target include a bonding target having a dry surface and/or a surface lacking pressure sensitive adhesiveness and a bonding target having a surface to be kept in a wet state so as not to dry. The dry surface is a surface not containing the liquid such as water. The surface lacking pressure sensitive adhesiveness is, for example, a surface having a minute concavo-convex structure in which recessed parts having a depth of about several µm and/or protrusions having a height of about several µm is formed. Examples of the surface to be kept in a wet state so as not to dry include a surface of a living body tissue such as an eye.

The gel layer 91 swells by absorbing a liquid such as water, and the constituent material is gel. A configuration in which the gel layer 91 is substituting to an elastomer layer 96 including an elastomer as the constituent material may be possible. As the gel, for example, hydrogel including polyacrylamide and polyacrylamide-2-methylpropanesulfonic acid and the like are preferable, and as the elastomer, for example, polydimethylsiloxane (PDMS) or the like is preferable. In the present embodiment, a mode in which a soft contact lens (material is poly(2-hydroxyethyl methacrylate) (abbreviation: P-HEMA)) is used as the gel layer 91 and a mode in which hydrogel including polyacrylamide and polyacrylamide-2-methylpropanesulfonic acid is used as the gel layer 91 may be provided.

A thickness TC of the gel layer 91 and the elastomer layer 96 is not particularly limited, and is, for example, in the range of 50 µm to 10 mm, and the thickness TC is 500 µm according to the present embodiment.

A portion including the film substrate 11 and the conductive material layer 12 is deformable in the same manner as in the conductive film 10 according to the first embodiment, and has durability to the repeating deformation. Therefore, even in a case where the gel layer 91 and the elastomer layer 96 absorb the liquid and swell or in a case where the gel layer 91 and the elastomer layer 96 evaporate the liquid and shrink, the state of being closely attached to the gel layer 91 or the elastomer layer 96 and the conductivity are maintained.

The film substrate 11 of the conductive film 90 may be set as a film substrate having another mesh shape such as the film substrate 71.

According to the present embodiment, the conductive film 90 is manufactured by overlapping the conductive film 10 and the gel layer 91 or the elastomer layer 96 in a state of including water as the liquid and swelling. As described above, the substrate opening portion 11c is formed on the second substrate surface 11b, and the film substrate 11 is closely attached by being overlapped with the gel layer 91 or the elastomer layer 96 by the capillary force due to the through holes 13. A gel layer or an elastomer layer in a state of not containing liquid and the conductive film 10 are overlapped with each other, even in a case where the liquid is absorbed in the gel layer or the elastomer layer, the conductive film 90 may be manufactured.

A predetermined pattern may be formed on the conductive material layer 12 of the conductive film 90. According to the present embodiment, with respect to the conductive material layer 12 of the conductive film 90 obtained in the above method, a patterning process is performed by the laser ablation, and an electrode pattern is formed to prepare an electrode material. The conductive film 90 includes the gel layer 91, the material is hydrogel including polyacrylamide and polyacrylamide-2-methylpropanesulfonic acid. The manufactured electrode material is placed on the peripheral surface of the pen. The electrode material is arranged such that the gel layer 91 comes into contact with the peripheral surface of the pen, and this electrode material is closely attached to the pen. In a state in which the electrode material is closely attached to the peripheral surface of the pen, a pair of terminals of the conductive tester is brought into contact with one end and the other end of the electrode pattern, and energization is confirmed by turning on the LED. In a case where this electrode material is wound around a finger of a human hand, this electrode material closely adheres to the finger. The energization of the electrode material in a state of being in close contact with the finger is confirmed by the aforementioned conductive tester.

Figure 19:
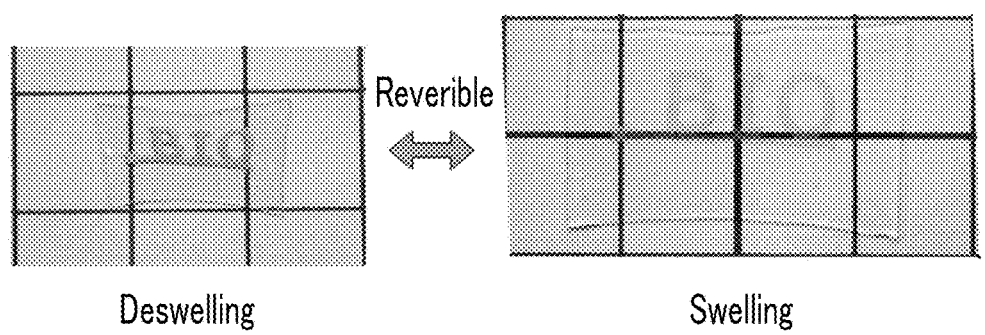
FIG. 19 is a photograph obtained by capturing the conductive film of the third embodiment before and after swelling with a digital camera.

As illustrated in FIG. 19, the same electrode material is placed on a substrate on which a 1 cm square mesh was drawn, and swelling and drying of the gel layer 91 of the conductive film 90 are repeated by absorption and evaporation of water. Black portions having shapes of letters "B", "I", and "O" arranged in one direction and dark lines connecting these characters to each other are an electrode pattern formed by the patterning process. As illustrated in FIG. 19, the conductive film 90 repeats a shrinkage state (left image) in which the gel layer 91 is in a dry state and an elongation state (right image) in which the gel layer 91 is in a swelling state. In a case where the gel layer 91 is in a swelling state, compared with a dry state, it is understood that the conductive film 90 mostly has twice the size.

What is claimed is:

1. A conductive film comprising:
a film substrate; and
a conductive material layer provided on a film substrate surface on one side of the film substrate,
wherein a plurality of through holes penetrating the film substrate and the conductive material layer in a thickness direction are formed,
wherein the conductive material layer has conductive portions between adjacent opening portions, the number of conductive portions is at least 400 per 1 mm$^2$, and an opening ratio of the conductive material layer is at least 40%, and
wherein the film substrate includes a hydrophobic polymer, and the hydrophobic polymer includes any one of polybutadiene, polyisoprene, a polydimethylsiloxane derivative, or polyisobutylene.

2. The conductive film according to claim 1, wherein a thickness of the film substrate is in a range of 0.2 µm to 20 µm.

3. The conductive film according to claim 1, wherein the plurality of through holes are regularly arranged along the film substrate surface on one side.

4. The conductive film according to claim 3, wherein the film substrate has a honeycomb-like structure in a case of being seen in a vertical direction of the film substrate surface on one side.

5. The conductive film according to claim 4, wherein a thickness of a partition between the adjacent through holes gradually decreases toward a center of the film substrate in a thickness direction.

6. The conductive film according to claim 5, wherein the partition has a partition wall opening portion on the center of the film substrate in the thickness direction.

7. The conductive film according to claim 1, wherein the conductive material layer is formed of gold, and a thickness of the conductive material layer is in a range of 10 nm to 50 nm.

8. The conductive film according to claim 1, wherein the conductive material layer is a member formed by a sputtering method.

9. The conductive film according to claim 1, further comprising:
 a gel layer or an elastomer layer on a film substrate surface on the other side of the film substrate.

* * * * *